United States Patent [19]
Linliu

[11] Patent Number: 5,924,000
[45] Date of Patent: Jul. 13, 1999

[54] METHOD FOR FORMING RESIDUE FREE PATTERNED POLYSILICON LAYER CONTAINING INTEGRATED CIRCUIT STRUCTURES

[75] Inventor: Kung Linliu, Taipei, Taiwan

[73] Assignee: Vanguard International Semiconductor Corporation, Hsin-Chu, Taiwan

[21] Appl. No.: 08/934,332

[22] Filed: Sep. 19, 1997

[51] Int. Cl.$^6$ .............................................. H01L 21/3205
[52] U.S. Cl. ......................... 438/592; 438/738; 438/963
[58] Field of Search ..................... 438/738, 963, 438/592

[56] References Cited

U.S. PATENT DOCUMENTS

| | | | |
|---|---|---|---|
| 5,021,121 | 6/1991 | Groechel et al. | 156/643 |
| 5,188,980 | 2/1993 | Lai | 437/193 |
| 5,346,586 | 9/1994 | Keller | 156/656 |
| 5,378,659 | 1/1995 | Roman et al. | 437/229 |
| 5,660,681 | 8/1997 | Fukuda et al. | 438/963 |

Primary Examiner—John F. Niebling
Assistant Examiner—Lynne A. Gurley
Attorney, Agent, or Firm—George O. Saile; Stephen B. Ackerman; Alek P. Szecsy

[57] ABSTRACT

A method for forming a patterned polysilicon layer employed within an integrated circuit structure. There is first provided a semiconductor substrate having formed thereupon a topographic substrate layer. There is then formed over the semiconductor substrate including the topographic substrate layer a polysilicon layer. There is then formed over the polysilicon layer an etch mask layer. There is then etched the polysilicon layer within a first reactive ion etch (RIE) plasma employing a first etchant gas composition which comprises a chlorine containing etchant species to form a patterned polysilicon layer and a patterned polysilicon containing layer residue. Finally, there is then over-etched the patterned polysilicon layer and the patterned polysilicon containing layer residue within a second reactive ion etch (RIE) plasma employing a second etchant gas composition which comprises an oxygen containing etchant species and a bromine containing etchant species. The patterned polysilicon layer is formed while etching the patterned polysilicon containing layer residue from over the topographic substrate layer.

11 Claims, 4 Drawing Sheets

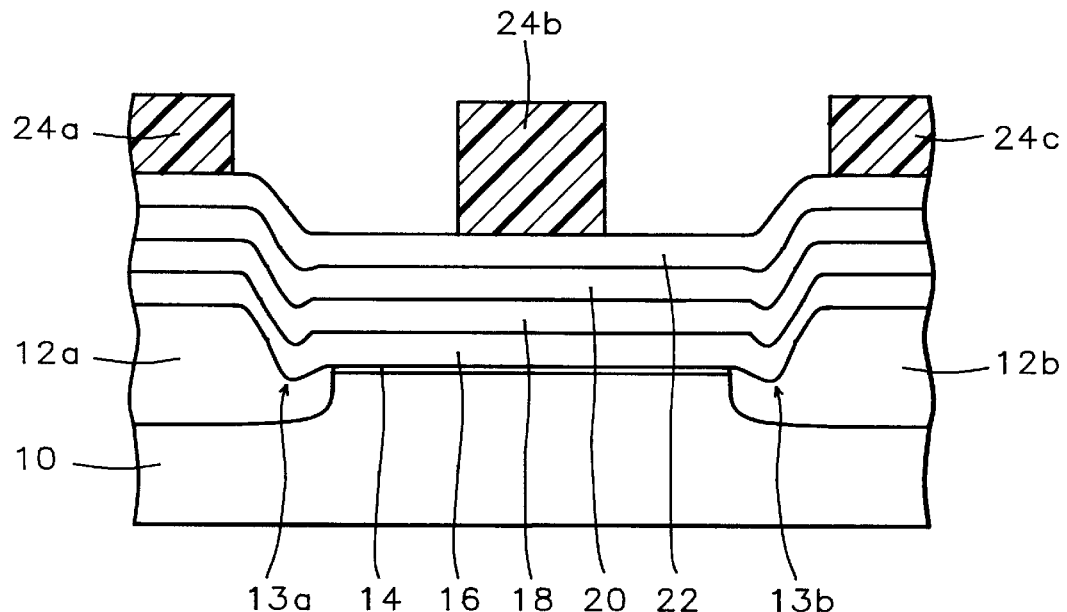
FIG. 1 – Prior Art
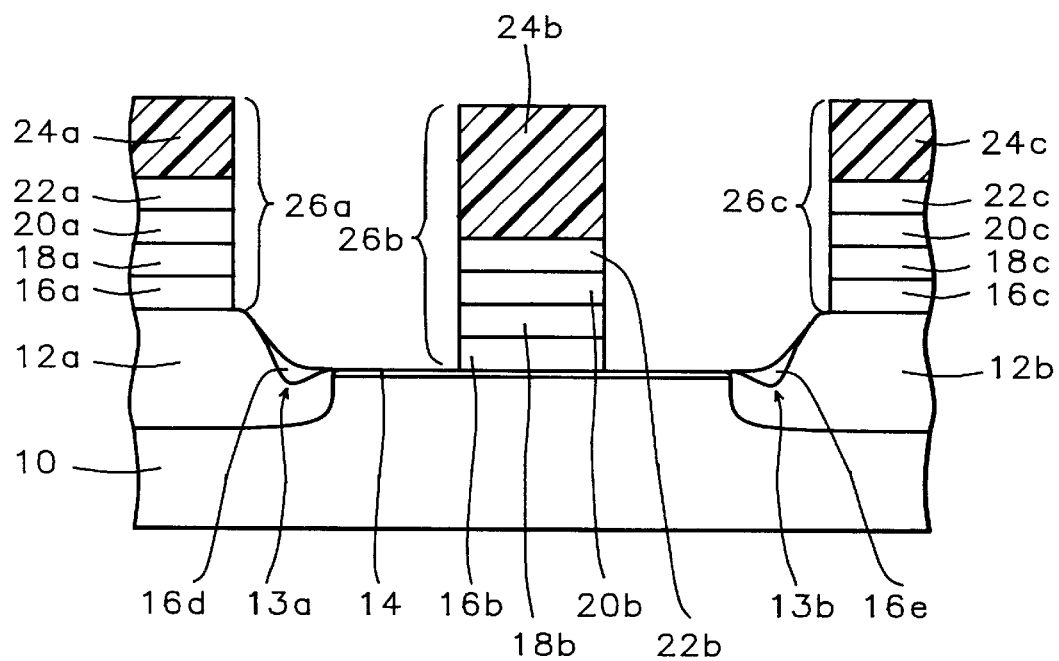
FIG. 2 – Prior Art

METHOD FOR FORMING RESIDUE FREE PATTERNED POLYSILICON LAYER CONTAINING INTEGRATED CIRCUIT STRUCTURES

BACKGROUND OF THE INVENTION

1. Field of the Invention

The present invention relates generally to methods for etching layers within integrated circuits. More particularly, the present invention relates to methods for etching polysilicon layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

When forming electrical circuit elements within integrated circuits, it is common in the art of integrated circuit fabrication to etch sequentially through multiple integrated circuit layers to form within integrated circuits patterned multi-layer integrated circuit structures employed within electrical cit elements within those integrated circuits. More particularly, it is common in the art of field effect transistor (FET) fabrication within integrated circuits to form patterned polysilicon or polycide gate electrode structures with self-aligned dielectric cap layers within those field effect transistors (FETs). While it is desirable in the art of integrated circuit fabrication to form patterned multi-layer integrated circuit structures, such as but not limited to patterned polysilicon or polycide gate electrode structures with self-aligned dielectric cap layers within field effect transistors (FETs), such multi-layer integrated circuit structures are not formed entirely without problems within integrated circuits.

In particular, problems which are encountered when forming such patterned multi-layer integrated circuit structures include, but are not limited to: (1) adventitious contamination of various portions of the integrated circuit structures due to adventitious atmospheric exposure when sequentially employing multiple independent etching reactors when forming the patterned multi-layer integrated circuit sutures; and (2) formation of residue layers within patterned multi-layer integrated circuit structures formed upon integrated circuit substrate layers of high topographic variation. A pair of schematic cross-sectional diagrams illustrating the latter of these two problems with respect to forming within an integrated circuit a multi-layer polycide gate electrode is shown in FIG. 1 and FIG. 2.

Shown in FIG. 1 is a semiconductor substrate 10 having formed therein and thereupon a pair of isolation regions 12a and 12b which define an active region of the semiconductor substrate 10. As is illustrated in FIG. 1, each of the isolation regions 12a and 12b has formed therein a cavity 13a or 13b closely adjoining the active region of the semiconductor substrate 10. The cavities 13a and 13b define a "bird's beak" region of the isolation regions 12a and 12b, where the cavities 13a and 13b are typically not readily avoidable when forming the isolation regions 12a and 12b through a thermal oxidation method as is conventional in the art of integrated circuit fabrication.

There is also shown in FIG. 1 a blanket gate dielectric layer 14 formed upon the active region of the semiconductor substrate 10 and a series of four blanket layers formed upon or over the isolation regions 12a and 12b and the blanket gate dielectric layer 14. The four blanket layers include: (1) a blanket polysilicon layer 16 formed upon the blanket gate dielectric layer 14 and the isolation regions 12a and 12b; (2) a blanket metal silicide layer 18 formed upon the blanket polysilicon layer 16; (3) a blanket cap dielectric layer 20 formed upon the blanket metal silicide layer 18; and (4) a blanket anti-reflective coating (ARC) layer 22 formed upon the blanket cap dielectric layer 20. Finally, there is shown in FIG. 1 a series of three patterned photoresist layers 24a, 24b and 24c which in the aggregate form a photoresist etch mask layer employed in forming from the series of four blanket layers a gate electrode structure over the active region of the semiconductor substrate 10 and a pair of interconnect structures upon the pair of isolation regions 12a and 12b.

Referring now to FIG. 2, there is shown a schematic cross-sectional diagram illustrating the results of further processing of the integrated circuit whose schematic cross-sectional diagram is illustrated in FIG. 1. Shown in FIG. 2 is the results of sequentially patterning the series of four blanket layers as shown in FIG. 1 to form the gate electrode structure 26b upon the active region of the semiconductor substrate 10 and the pair of interconnect structures 26a and 26c upon the corresponding isolation regions 12a and 12b.

When forming from the integrated circuit whose schematic cross-sectional diagram is illustrated in FIG. 1 the integrated circuit whose schematic cross-sectional diagram is illustrated in FIG. 2, there is typically formed within each cavity 13a or 13b a corresponding patterned polysilicon layer residue 16d or 16e, as illustrated in FIG. 2. The patterned polysilicon layer residues 16d and 16e typically result from either incomplete or shadowed etching of the polysilicon layer 16. Although not specifically illustrated within the schematic cross-sectional diagrams of FIG. 1 and FIG. 2, the blanket anti-reflective coating (ARC) layer 22 and the blanket cap dielectric layer 20 are typically etched through a first reactive ion etch (RIE) method optimized to etch the blanket cap dielectric layer 20, while the blanket metal silicide layer 18 and the blanket polysilicon layer 16 are typically etched through an independent second reactive ion etch (RIE) method optimized to etch the blanket polysilicon layer 16. The selective optimization of the first reactive ion etch (RIE) method for the blanket cap dielectric layer 20 and the second reactive ion etch (RIE) method for the blanket polysilicon layer 16 presumably contributes to formation of the patterned polysilicon layer residues 16d and 16e. Polysilicon layer residues, such as the patterned polysilicon layer residues 16d and 16e, are undesirable within integrated circuit fabrication since they may compromise the functionality or reliability of an integrated circuit within which they are formed.

It is thus in general towards forming within integrated circuits patterned polysilicon layers upon topographic substrate layers while avoiding forming patterned polysilicon layer residues upon the topographic substrate layers that the present invention is generally directed.

Various novel methods for patterning and etching integrated circuit layers within integrated circuits have been disclosed within the art of integrated circuit fabrication. For example, Groechel et al., in U.S. Pat. No. 5,021,121, discloses a method for etching with high selectivity with respect to a silicon substrate layer a via with nearly vertical sidewalls through a silicon oxide dielectric layer formed upon the silicon substrate layer. The method employs specific flow rates of an inert gas, tri-fluoromethane and carbon tetrafluoride.

In addition, Lai, in U.S. Pat. No. 5,188,980, discloses a method for etching, without undercutting, a tungsten silicide polycide gate electrode within a field effect transistor (FET) within an integrated circuit. The method employs a first mixture of chlorine and helium when etching the tungsten silicide layer within the tungsten silicide polycide gate electrode, followed by a helium purge prior to employing a second mixture of chlorine and helium when etching the polysilicon layer within the tungsten silicide polycide gate electrode.

Finally, Roman et al., in U.S. Pat. No. 5,378,659, discloses a method for forming, without reflective notching, an integrated circuit pattern upon a semiconductor substrate. The method employs an anti-reflective layer formed of silicon rich silicon nitride formed beneath a photoresist layer employed in defining the integrated circuit pattern Desirable in the art are additional methods for forming within integrated circuits patterned layers, such as patterned polysilicon layers. More particularly desirable in the art are additional methods for forming patterned polysilicon layers upon topographic substrate layers within integrated circuits without forming patterned polysilicon layer residues upon the topographic substrate layers. Most particularly desirable in the art are additional methods for forming within integrated circuits multi-layer patterned polysilicon layer containing integrated circuit structures upon topographic substrate layers within integrated circuits without forming patterned polysilicon layer residues upon the topographic substrate layers. It is towards these goals that the present invention is more specifically directed.

SUMMARY OF THE INVENTION

A first object of the present invention is to provide a method for forming within an integrated circuit a patterned polysilicon layer.

A second object of the present invention is to provide a method in accord with the first object of the present invention, where the patterned polysilicon layer is formed upon a topographic substrate layer without forming patterned polysilicon layer residues upon the topographic substrate layer.

A third object of the present invention is to provide a method in accord with the first object of the present invention and the second object of the present invention, where the patterned polysilicon layer is employed in a multi-layer patterned polysilicon layer containing integrated circuit structure within the integrated circuit.

A fourth object of the present invention is to provide a method in accord with the third object of the present invention, where there is also avoided adventitious atmospheric contamination of the multi-layer patterned polysilicon layer containing integrated circuit structure within the integrated circuit.

A fifth object of the present invention is to provide a method in accord with the first object of the present invention, the second object of the present invention, the third object of the present invention or the fourth object of the present invention, which method is readily manufacturable.

In accord with the objects of the present invention, there is provided by the present invention a method for forming within an integrated circuit a patterned polysilicon layer. To practice the method of the present invention, there is first provided a semiconductor substrate having formed thereupon a topographic substrate layer. There is then formed over the semiconductor substrate including the topographic substrate layer a polysilicon layer. There is then formed over the polysilicon layer an etch mask layer. There is then etched the polysilicon layer through a first reactive ion etch method employing a first plasma employing a first etchant gas composition which comprises a chlorine containing etchant species to form a patterned polysilicon layer and a pattered polysilicon layer residue upon the topographic substrate layer. Finally, there is then over-etched the integrated circuit through a second reactive ion etch (RIE) method employing a second plasma employing a second etchant gas composition which comprises an oxygen containing etchant species and a bromine containing etchant species.

There is provided by the present invention a method for forming within an integrated circuit a patterned polysilicon layer upon a topographic substrate layer without forming patterned polysilicon layer residues upon the topographic substrate layer. The method of the present invention realizes this object by over-etching the integrated circuit with the second plasma which employs the second etchant gas composition which comprises the oxygen containing etchant species and the bromine containing etchant species.

The method of the present invention may be employed where the patterned polysilicon layer is employed in a multi-layer patterned polysilicon layer containing integrated circuit structure within the integrated circuit. The present invention does not discriminate with respect to the nature of the integrated circuit structure within which is formed the patterned polysilicon layer. Thus, the patterned polysilicon layer may be employed in a multi-layer patterned polysilicon layer containing integrated circuit structure within the integrated circuit.

Through the method of the present invention there may be avoided adventitious atmospheric contamination of the multi-layer patterned polysilicon layer containing integrated circuit structure within the integrated circuit. The method of the present invention realizes this object by undertaking all reactive ion etch (RIE) methods employed in forming the multi-layer patterned polysilicon layer containing integrated circuit structure sequentially in-situ within a single reactor chamber or within adjoining reactor chambers within a singe multi-chamber reactor tool.

The method of the present invention is readily manufacturable. The method of the present invention provides a novel ordering of reactive ion etch (RIE) methods employing plasmas which are otherwise generally known in the art of integrated circuit fabrication. Thus, the method of the present invention is readily manufacturable

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating patterned polysilicon layer residue formation incident to forming a series of multi-layer patterned polysilicon layer contamig gate electrode type structures upon a topographic substrate layer within an integrated circuit through a method conventional in the art of integrated circuit fabrication.

DESCRIPTION OF THE PREFERRED EMBODIMENT

The present invention provides a method for forming within an integrated circuit a patterned polysilicon layer upon a topographic substrate layer without forming patterned polysilicon layer residues upon the topographic substrate layer. The method of the present invention realizes this object by over-etching an integrated circuit having formed therein a patterned polysilicon layer and a patterned polysilicon layer residue within a reactive ion etch (RIE) plasma employing an etchant gas composition comprising an oxygen containing etchant species and a bromine containing etchant species.

The method of the present invention may also be employed when forming multi-layer patterned polysilicon layer containing integrated circuit structures within integrated circuits, while simultaneously avoiding atmospheric induced contamination of the multi-layer patterned polysilicon layer containing integrated circuit structures. The method of the present invention realizes this object by providing all of the reactive ion etch (RIE) plasmas employed in forming the multi-layer patterned polysilicon layer containing integrated circuit structure sequential in-situ within the same reactor chamber or within adjoining reactor chambers within a single multi-chamber reactor tool.

Figure 3:
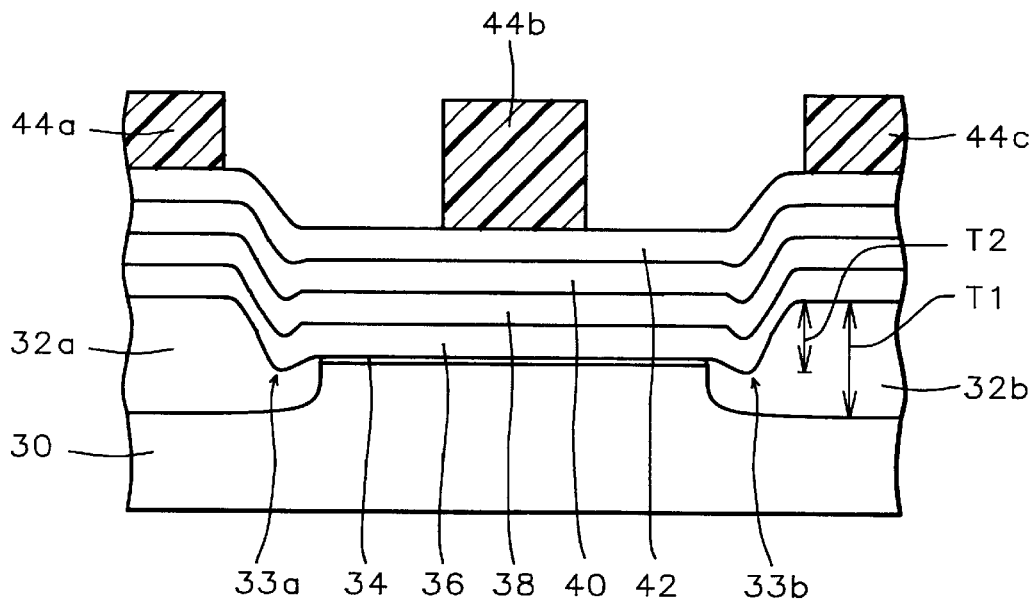
FIG. 3 to FIG. 7 show a series of schematic cross-sectional diagrams illustrating the results of progressive stages in forming a series of multi-layer patterned polysilicon layer containing gate electrode type structures upon a topographic substrate layer within an integrated without forming patterned polysilicon layer residues through the preferred embodiment of the method of the present invention.

Referring now to FIG. 3 to FIG. 7, there is shown a series of schematic cross-sectional diagrams illustrating the results of forming upon a topographic substrate layer within an integrated circuit in accord with the preferred embodiment of the method of the present invention a patterned dielectric capped polycide gate electrode structure and a pair of patterned dielectric capped polycide interconnect structures without forming patterned polysilicon layer residues upon the topographic substrate layer. Shown in FIG. 3 is a schematic cross-sectional diagram of the integrated circuit at an early stage in its fabrication.

Shown in FIG. 3 is a semiconductor substrate 30 having formed therein and thereupon a pair of isolation regions 32a and 32b which define an active region of the semiconductor substrate 30. Although semiconductor substrates are known in the art with either dopant polarity, several dopant concentrations and various crystallographic orientations, for the preferred embodiment of the method of the present invention, the semiconductor substrate 30 is preferably a (100) silicon semiconductor substrate having an N- or P-doping.

As is shown in FIG. 3, each of the isolation regions 32a and 32b which define the active region of the semiconductor substrate 30 has a cavity 33a or 33b formed therein at a location closely adjoining the active region of the semiconductor substrate 30. The cavities 33a and 33b are formed incident to a thermal oxidation method through which the isolation regions 32a and 32b are formed within and upon the semiconductor substrate 30. The cavities 33a and 33b define a pair of "bird's beak" regions of the isolation regions 32a and 32b. Typically, each of the isolation regions 32a and 32b has a maximum thickness T1 at a location spaced from the active region of the semiconductor substrate 30 of from about 2500 to about 3100 angstroms, while each of the isolation regions 32a and 32b also has a step height T2 at the location of the cavity 33a or 33b of from about 1200 to about 1600 angstroms, where T1 and T2 are defined as illustrated in FIG. 1.

Also shown within FIG. 3 formed upon the active region of the semiconductor substrate 30 is a blanket gate dielectric layer 34. Gate dielectric layers are conventional in the art of integrated circuit fabrication. Gate dielectric layers may be formed within integrated circuits through methods including but not limited to gate dielectric layer deposition methods and gate dielectric layer thermal growth methods through which may be formed gate dielectric layers typically of silicon oxide dielectric materials. For the preferred embodiment of the method of the present invention, the blanket gate dielectric layer 34 is preferably formed through a gate dielectric layer thermal growth method at a temperature of from about 700 to about 1000 degrees centigrade to form the blanket gate dielectric layer 34 of silicon oxide of thickness about 60 to about 180 angstroms upon the active region of the semiconductor substrate 30.

Also shown within FIG. 3 formed upon or over the blanket gate dielectric layer 34 and the isolation regions 32a and 32b is a series of four blanket layers. The four blanket layers include: (1) a blanket polysilicon layer 36 formed upon the isolation regions 32a and 32b and the blanket gate dielectric layer 34; (2) a blanket metal silicide layer 38 formed upon the blanket polysilicon layer 36; (3) a blanket cap dielectric layer 40 formed upon the blanket metal silicide layer 38; and (4) a blanket anti-reflective coating (ARC) layer 42 formed upon the blanket cap dielectric layer 40. Each of the preceding four blanket layers may be formed through methods and materials as are common in the art of integrated circuit fabrication.

For example, although it is known in the art of integrated circuit fabrication that polysilicon layers may be formed within integrated circuits through methods including but not limited to chemical vapor deposition (CVD) methods, low pressure chemical vapor deposition (LPCVD) methods, plasma enhanced chemical vapor deposition (PECVD) methods and physical vapor deposition (PVD) sputtering methods, for the preferred embodiment of the method of the present invention, the blanket polysilicon layer 36 is preferably formed upon the blanket gate dielectric layer 34 and the isolation regions 32a and 32b through a low pressure chemical vapor deposition (LPCVD) method employing a suitable silicon source material to form the blanket polysilicon layer 36 of thickness about 1000 to about 2000 angstroms upon the blanket gate dielectric layer 34 and the isolation regions 32a and 32b. Typically and preferably, the blanket polysilicon layer 36 has incorporated therein suitable dopants to provide the blanket polysilicon layer 36 with a resistivity of from about 80 to about 120 ohms per square.

Similarly, although it is also known in the art of integrated circuit fabrication that metal silicide layers may be formed through methods including but not limited to thermal annealing methods, chemical vapor deposition (CVD) methods and physical vapor deposition (PVD) sputtering methods through which may be formed metal silicide layers of metal silicides including but not limited to tungsten silicide, titanium silicide and cobalt silicide, for the preferred embodiment of the method of the present invention, the blanket metal silicide layer 38 is preferably formed of tungsten silicide deposited upon the blanket polysilicon layer 36 through a chemical vapor deposition (CVD) method to a thickness of from about 1000 to about 2000 angstroms. Metal silicides formed through other methods and materials may, however, also be employed in forming the blanket metal silicide layer 38.

In addition, although it is also known in the art of integrated circuit fabrication that dielectric layers may be formed within integrated circuits through methods and materials including but not limited to chemical vapor deposition (CVD) methods, plasma enhanced chemical vapor deposition (PECVD) methods and physical vapor deposition (PVD) sputtering methods through which may be formed dielectric layers of dielectric materials including but not limited to silicon oxide dielectric materials, silicon nitride dielectric materials and silicon oxynitride dielectric materials, for the preferred embodiment of the method of the present invention the blanket cap dielectric layer 40 is preferably formed of a silicon oxide dielectric material a silicon nitride dielectric material or a silicon oxynitride dielectric material deposited through a chemical vapor deposition (CVD) method, as is conventional in the art of integrated circuit fabrication. Preferably, the blanket cap dielectric layer 40 is formed to a thickness of from about 1000 to about 3000 angstroms.

Finally, although it is also known in the art of integrated circuit fabrication that anti-reflective coating (ARC) layers may be formed within integrated circuits through methods including but not limited to spin coating methods, chemical vapor deposition (CVD) methods and physical vapor deposition (VD) sputtering methods through which may be formed anti-reflective coating (ARC) layers of anti-reflective materials including but not limited to dyed organic polymer anti-reflective materials and inorganic oxide thin film anti-reflective materials (such as various inorganic nitride thin film anti-reflective materials and inorganic oxide thin film anti-reflective materials), for the preferred embodiment of the method of the present invention the blanket anti-reflective coating (ARC) layer 42 is preferably formed of a dyed organic polymer anti-reflective material coated and cured upon the blanket cap dielectric layer 40 to a thickness of from about 700 to about 2000 angstroms.

Finally, there is shown in FIG. 3 the presence of a series of patterned photoresist layers 44*a*, 44*b* and 44*c* formed upon the blanket anti-reflective coating (ARC) layer 42. Although it is known in the art of integrated circuit fabrication that patterned photoresist layers may be formed from photoresist materials selected from the general groups of photoresist materials including but not limited to positive photoresist materials and negative photoresist materials, for the preferred embodiment of the method of the present invention the patterned photoresist layers 44*a*, 44*b* and 44*c* are preferably formed of a positive photoresist material, formed upon the blanket anti-reflective coating (ARC) layer 42 to a thickness of from about 7000 to about 20000 angstroms, although photoresist layers of other photoresist materials nay also be employed in forming the series of patterned photoresist layers 44*a*, 44*b* and 44*c*. Typically and preferably, the patterned photoresist layers 44*a*, 44*b* and 44*b* are defined by minimum linewidth and pitch dimensions of from about 0.7 to about 1.0 microns.

Figure 4:
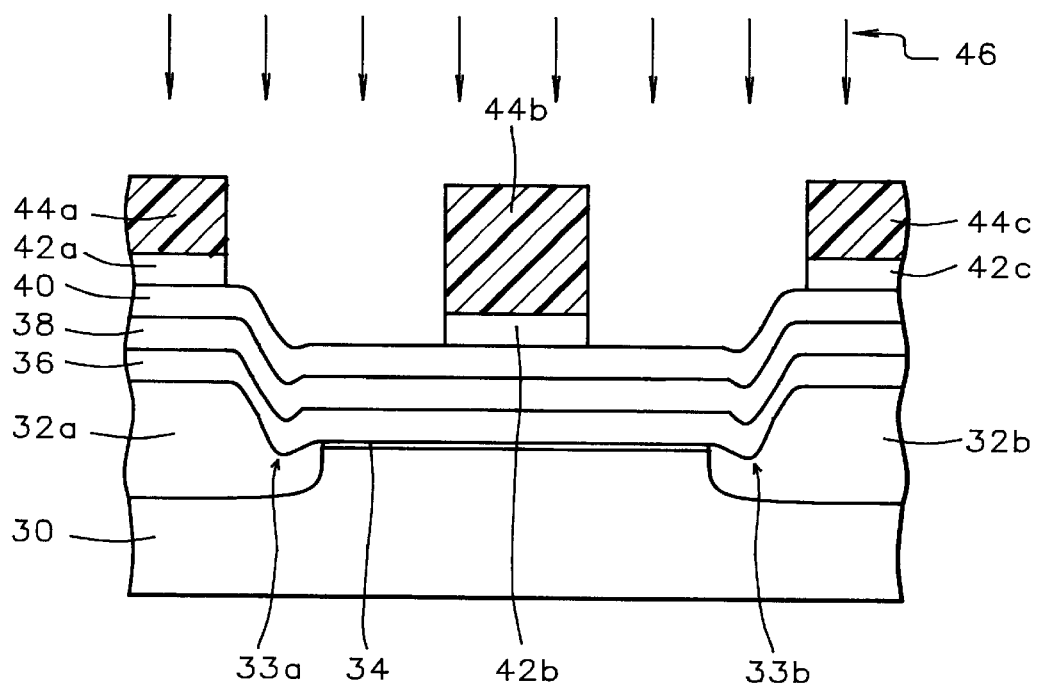

Referring now to FIG. 4, there is shown a schematic cross-sectional diagram illustrating the results of further processing of the integrated circuit whose schematic cross-sectional diagram is illustrated in FIG. 3. Shown in FIG. 4 is a schematic cross-sectional diagram of an integrated circuit otherwise equivalent to the integrated circuit whose schematic cross-sectional diagram is illustrated in FIG. 3, but wherein the blanket anti-reflective coating (ARC) layer 42 has been patterned to form the patterned anti-reflective coating (ARC) layers 42*a*, 42*b* and 42*c*. As is illustrated in FIG. 4, the blanket anti-reflective coating (ARC) layer 42 is patterned to form the patterned anti-reflective coating layers 42*a*, 42*b* and 42*c* through use of a first reactive ion etch (RIE) method employing a first plasma 46.

Within the preferred embodiment of the method of the present invention, where the anti-reflective coating (ARC) layer 42 is formed from a dyed organic polymer anti-reflective material, the first plasma 46 employs a first etchant gas composition comprising an oxygen containing etchant species and a bromine containing etchant species. Preferably the oxygen containing etchant species is oxygen, although other oxygen containing etchant species, such as but not limited to ozone, nitrous oxide and nitric oxide, may also be employed. Similarly, the bromine containing etchant species is preferably hydrogen bromide, although other bromine containing etchant species, such as but not limited to bromine, may also be employed within the method of the present invention.

Preferably, the first reactive ion etch (RIE) method also employs: (1) a reactor chamber pressure of from about 4 to about 10 mtorr; (2) a source radio frequency power of from about 150 to about 250 watts at a radio frequency of 13.56 MHZ; (3) a bias power of from about 100 to about 200 watts; (4) a semiconductor substrate 30 temperature of from about 50 to about 70 degrees centigrade (provided a backside helium flow rate of from about 6 to about 8 standard cubic centimeters per minute (sccm)); (5) a hydrogen bromide flow rate of from about 30 to about 60 standard cubic centimeters per minute (sccm); and (6) a 70:30 helium:oxygen flow rate of from about 10 to about 14 standard cubic centimeters per minute (sccm).

Figure 5:
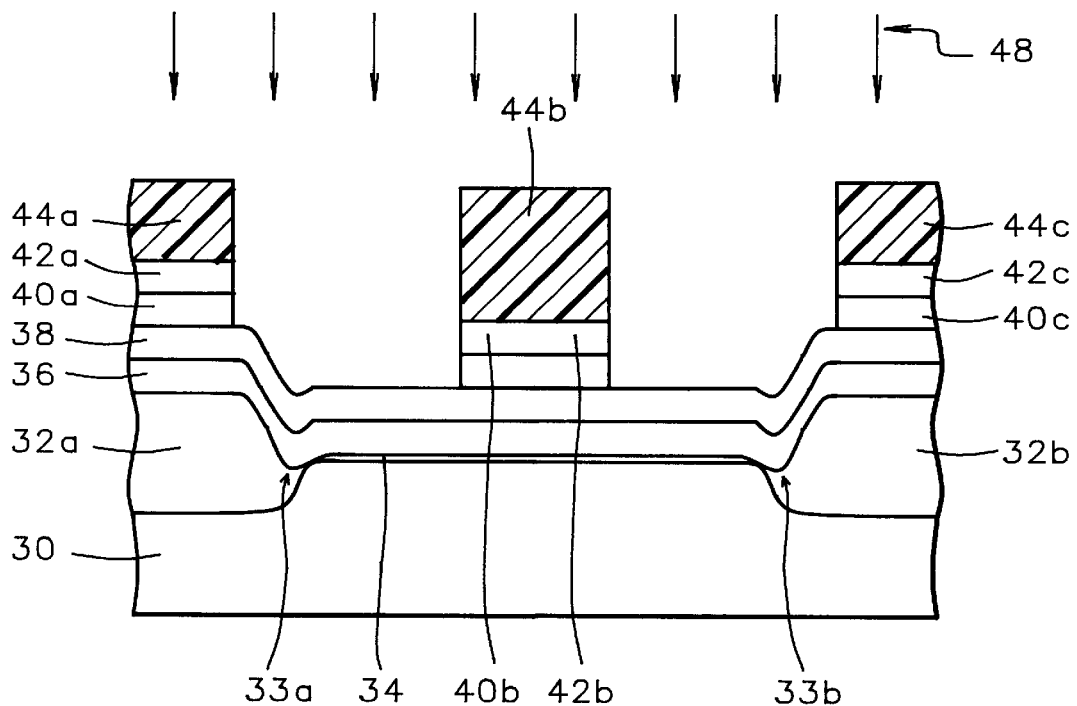

Referring now to FIG. 5, there is shown a schematic cross-sectional diagram illustrating the results of further processing of the integrated circuit whose schematic cross-sectional diagram is illustrated in FIG. 4. Shown in FIG. 5 is a schematic cross-sectional diagram of an integrated circuit otherwise equivalent to the integrated circuit whose schematic cross-sectional diagram is illustrated in FIG. 4, but wherein the blanket cap dielectric layer 40 has been patterned to yield the patterned cap dielectric layers 40*a*, 40*b* and 40*c*, through use of a second reactive ion etch (RIE) method employing a second plasma 48, while employing at least the patterned anti-reflective coating (ARC) layers 42*a*, 42*b* and 42*c* as an etch mask layer.

Within the preferred embodiment of the method of the present invention, where the blanket cap dielectric layer 40 is preferably formed of a dielectric material selected from the group of dielectric materials consisting of silicon oxide dielectric materials, silicon nitride dielectric materials and silicon oxynitride dielectric materials, the second plasma 48 preferably employs a second etchant gas composition comprising a fluorine containing etchant species. Preferably, the fluorine containing etchant species is formed from a fluorocarbon etchant gas selected from the group of fluorocarbon etchant gases consisting of C1-C3 perfluorocarbons (ie: perfluorocarbons having up to three carbon atoms) and C1-C3 hydrofluorocarbons (ie: hydrofluorocarbons having up to three carbon atoms). More preferably, the second etchant gas composition comprises a carbon tetrafluoride fluorocarbon etchant gas.

Preferably, the second reactive ion etch (RIE) method also employs: (1) a reactor chaber pressure of from about 4 to about 10 mtorr; (2) a source radio frequency power of from about 400 to about 600 watts at a radio frequency of 13.56 MHZ; (3) a bias power of from about 150 to about 250 watts; (4) a semiconductor substrate 30 temperature of from about 50 to about 70 degrees centigrade (provided by a backside helium flow of from about 6 to about 8 standard cubic centimeters per minute (sccm)); (5) a carbon tetrafluoride flow rate of from about 40 to about 60 standard cubic centimeters per minute (sccm); and (6) a helium flow rate of from about 70 to about 130 standard cubic centimeters per minute (sccm).

Figure 6:
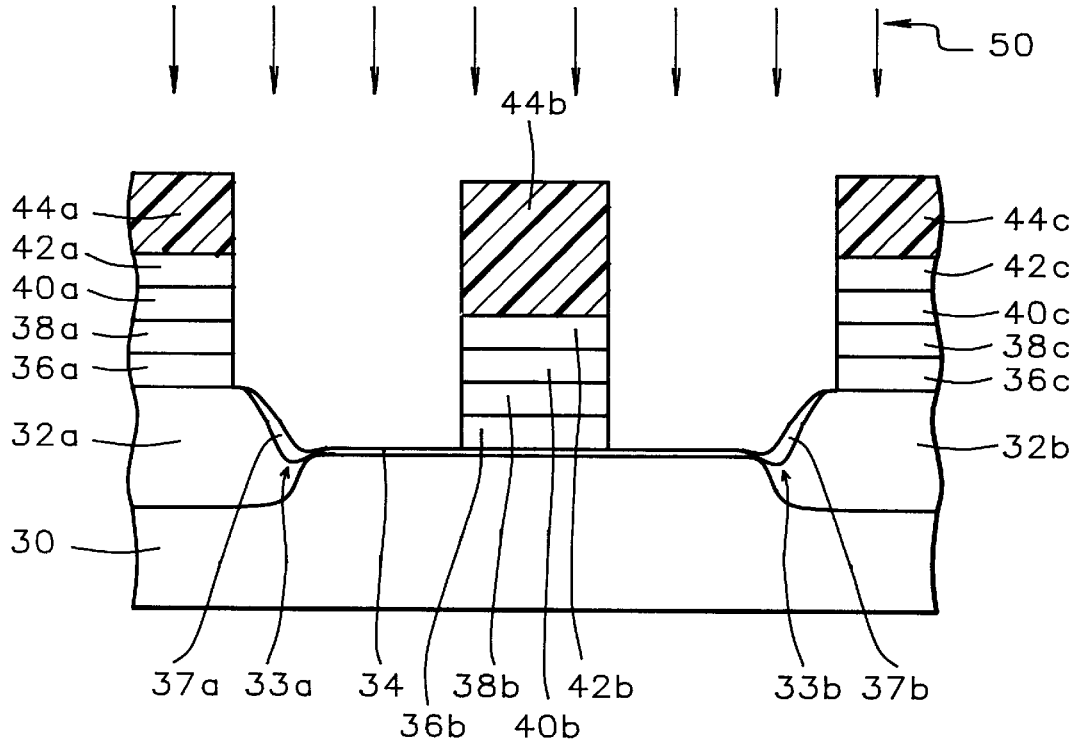

Referring now to FIG. 6, there is shown a schematic cross-sectional diagram of an integrated circuit illustrating the results of further processing of the integrated circuit whose schematic cross-sectional diagram is illustrated in FIG. 5. Shown in FIG. 6 is a schematic cross-sectional diagram of an integrated circuit otherwise equivalent to the integrated circuit whose schematic cross-sectional diagram is illustrated in FIG. 5, but wherein the blanket metal silicide layer 38 and the blanket polysilicon layer 36 are etched to form the patterned metal silicide layers 38a, 38b and 38c, and the corresponding patterned polysilicon layers 36a, 36b and 36c, through use of a third reactive ion etch (RIE) method employing a third plasma 50. As is illustrated in FIG. 6, there is also formed the patterned polysilicon containing layer residues 37a and 37b within the corresponding cavities 33a and 33b within the corresponding isolation regions 32a and 32b. As is similarly also illustrated within the schematic cross-sectional diagram of FIG. 6, each patterned polysilicon containing layer residue 37a or 37b within the pair of patterned polysilicon containing layer residues 37a and 37b is formed unmasked (ie: not covered by a patterned photoresist layer) and separated from the an adjacent patterned polysilicon layer 36a, 36b or 36c. The third reactive ion etch (RIE) method employs at least the patterned cap dielectric layers 40a, 40b and 40c as an etch mask layer.

Within the preferred embodiment of the method of the present invention, the third plasma 50 employs a third etchant gas composition which comprises a chlorine containing etchant species. More preferably, the third etchant gas composition comprises a chlorine etchant gas, although other chlorine containing etchant gases, such as but not limited to hydrogen chloride, may also be employed.

Preferably, the third reactive ion etch (RIE) method also employs: (1) a reactor chamber pressure of from about 4 to about 8 mtorr; (2) a radio frequency power of from about 200 to about 300 watts; (3) a bias power of from about 70 to about 130 watts; (4) a semiconductor substrate 30 temperature of from about 50 to about 70 degrees centigrade (provided by a backside helium flow of from about 6 to about 8 standard cubic centimeters per minute (sccm)); and (5) a chlorine flow rate of from about 80 to about 100 standard cubic centimeters per minute (sccm).

Figure 7:
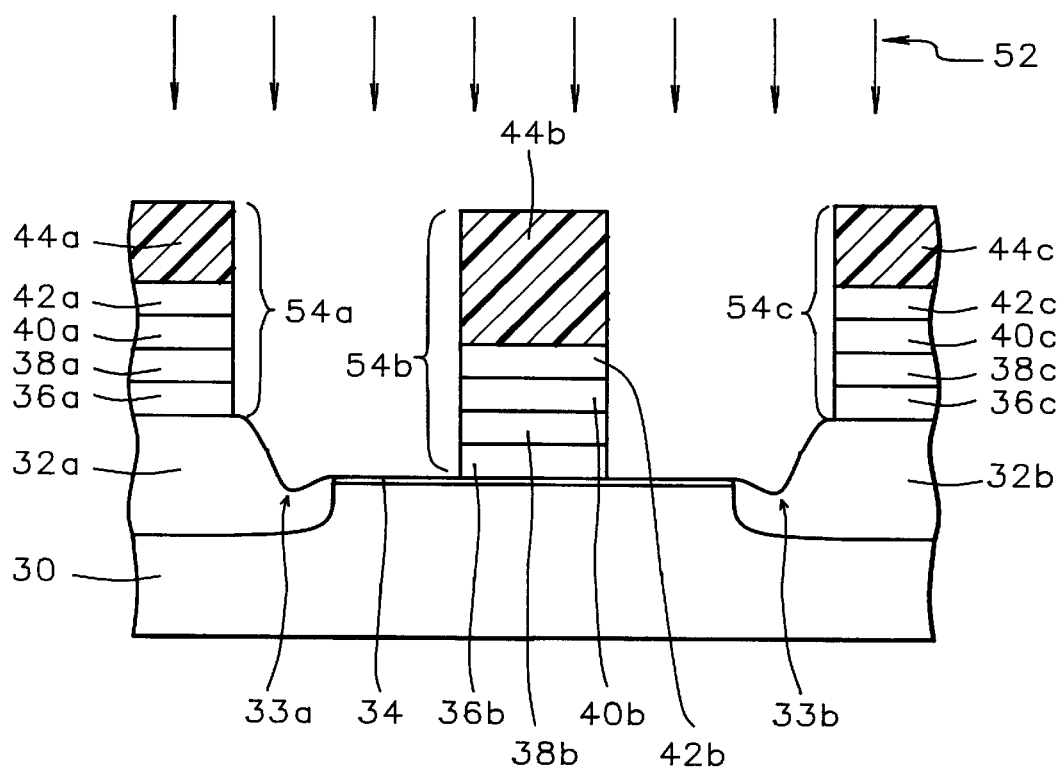

Referring now to FIG. 7, there is shown a schematic cross-sectional diagram illustrating the results of further processing of the integrated circuit whose schematic cross-sectional diagram is illustrated in FIG. 6. Shown in FIG. 7 is a schematic cross-sectional diagram of an integrated circuit otherwise equivalent to the integrated circuit whose schematic cross-sectional diagram is illustrated in FIG. 6, but wherein the patterned polysilicon containing layer residues 37a and 37b have been removed through use of a fourth reactive ion etch (RIE) method which employs a fourth plasma 52.

Within the preferred embodiment of the method of the present invention, the fourth plasma 52 employs a fourth etchant gas composition which comprises an oxygen containing etchant species and a bromine containing etchant species. More preferably, the fourth plasma 52 employs a fourth etchant gas composition which comprises an oxygen etchant gas and a hydrogen bromide etchant gas. Other oxygen containing etchant gases, such as but not limited to ozone, nitrous oxide, and nitric oxide, may also be employed within the fourth plasma 52. Similarly, other bromine containing etchant gases, such as but not limited to bromine, may also be employed within the fourth plasma 52.

Preferably, the fourth reactive ion etch (RIE) method also employs: (1) a reactor chamber pressure of from about 40 to about 60 mtorr; (2) a source radio frequency power of from about 250 to about 350 watts at a radio frequency of 13.56 MHZ; (3) a bias power of from about 90 to about 150 watts; (4) a semiconductor substrate temperature of from about 50 to about 70 degrees centigrade (provided by a backside helium flow rate of from about 6 to about 8 standard cubic centimeters per minute (sccm)); (5) an oxygen flow rate of from about 80 to about 120 standard cubic centimeters per minute (sccm); and (5) a hydrogen bromide flow rate of from about 80 to about 120 standard cubic centimeters per minute (sccm).

Upon forming the integrated circuit whose schematic cross-sectional diagram is illustrated in FIG. 7, there is formed an integrated circuit having formed therein upon a topographic substrate layer a pair of multi-layer patterned polysilicon layer containing interconnect structures 54a and 54c and a multi-layer patterned polysilicon layer containing polycide gate electrode structure 54b. The pair of multi-layer patterned polysilicon layer containing interconnect structures 54a and 54c and the multi-layer patterned polysilicon layer containing polycide gate electrode structure 54b are formed through the method of the present invention without forming patterned polysilicon layer residues upon the topographic substrate layer.

Although not specifically illustrated by the schematic cross-sectional diagrams of FIG. 3 to FIG. 7 it is also feasible and preferred within the preferred embodiment of the method of the present invention that the series of the first reactive ion etch (RIE) method, the second reactive ion etch (RIE) method, the third reactive ion etch (RIE) method and the fourth reactive ion etch (RIE) method are undertaken sequentially in-situ within the same reactive ion etch (RIE) reactor chamber or within adjoining reactor chambers within a single multi-chamber reactive ion etch (RIE) reactor tool. Under such circumstances there is avoided atmospheric contamination of the integrated circuit whose schematic cross-sectional is illustrated in FIG. 7 when forming the integrated circuit whose schematic cross-sectional diagram is illustrated in FIG. 7 from the integrated circuit whose schematic cross-sectional diagram is illustrated in FIG. 3. Atmospheric contamination may include, but is not limited to, atmospheric gaseous contamination and atmospheric particulate contamination.

As is understood by a person skilled in the art, the preferred embodiment of the method of the present invention is illustrative of the present invention rather than limiting of the present invention. Revisions and modifications may be made to methods, materials, structures and dimensions through which is provided the preferred embodiment of the method of the present invention while still providing embodiments which are within the spirit and scope of the present invention, as defined by the accompanying claims.

What is claimed is:

1. A method for forming a patterned polysilicon layer comprising:

providing a semiconductor substrate having formed thereupon a topographic substrate layer the topographic substrate layer including a bird's beak cavity region and an isolation region;

forming over the semiconductor substrate including the topographic substrate layer a polysilicon layer;

forming over the polysilicon layer an etch mask layer;

etching the polysilicon layer within a first reactive ion etch (RIE) plasma employing a first etchant gas composition which comprises a chlorine containing etchant species to form a patterned polysilicon layer and a patterned polysilicon containing layer residue over the semiconductor substrate and in the cavity and the isolation regions; and over-etching the patterned polysilicon layer and the patterned polysilicon containing layer residue within a second reactive ion etch (RIE) plasma employing a second etchant gas composition which comprises an oxygen containing etchant species and a bromine containing etchant species, to strip from over the semiconductor substrate and from the cavity and isolation regions the patterned polysilicon containing layer residue while leaving remaining over the semiconductor substrate the patterned polysilicon layer.

2. The method of claim 1 wherein the second etchant gas composition comprises oxygen and hydrogen bromide.

3. The method of claim 2 wherein the second reactive ion etch (RIE) plasma also employs:

a reactor chamber pressure of from about 40 to about 60 mtorr;

a radio frequency power of from about 250 to about 350 watts;

an oxygen flow rate of from about 80 to about 120 standard cubic centimeters per minute; and a hydrogen bromide flow rate of from about 80 to about 120 standard cubic centimeters per minute.

4. The method of claim 1 wherein the patterned polysilicon layer is employed within an integrated circuit structure selected from the group of integrated circuit structures consisting of gate electrode structures and interconnect structures.

5. The method of claim 1 wherein the first reactive ion etch (RIE) plasma and the second reactive ion etch (RIE) plasma are provided sequentially in-situ.

6. The method of claim 1 further comprising:

forming over the polysilicon layer a dielectric layer prior to forming over the polysilicon layer the etch mask layer, where the dielectric layer is formed from a dielectric material selected from the group of dielectric materials consisting of silicon oxide dielectric materials, silicon nitride dielectric materials and silicon oxynitride dielectric materials; and etching the dielectric layer within a third reactive ion etch (RIE) plasma employing a third etchant gas composition which comprises a fluorine containing etchant species to form a patterned dielectric layer prior to etching the polysilicon layer within the first reactive ion etch (RIE) plasma.

7. The method of claim 6 wherein the third reactive ion etch (RIE) plasma, the first reactive ion etch (RIE) plasma and the second reactive ion etch (RIE) plasma are provided sequentially in-situ in the order of the third reactive ion etch ME) plasma, followed by the second reactive ion etch (RIE) plasma, in turn followed by the first reactive ion etch (RIE) plasma.

8. The method of claim 6 further comprising:

forming upon the dielectric layer an anti-reflective coating (ARC) layer prior to forming over polysilicon layer the etch mask layer, where the anti-reflective coating (ARC) layer is formed from a dyed organic polymer anti-reflective coating (ARC) material; and etching the anti-reflective coating (ARC) layer within a fourth reactive ion etch (RIE) plasma employing a fourth etchant gas composition comprising an oxygen containing etchant species and a bromine containing etchant species to form a patterned anti-reflective coating (ARC) layer prior to etching the dielectric layer within the third reactive ion etch (RIE) plasma.

9. The method of claim 8 wherein the fourth reactive ion etch (RIE) plasma, the third reactive ion etch (RIE) plasma, the first reactive ion etch (RIE) plasma and the second reactive ion etch (RIE) plasma are provided sequentially in-situ in the order of the fourth reactive ion etch (RIE) plasma, followed by the third reactive ion etch (RIE) plasma, in turn followed by the first reactive ion etch (RIE) plasma, further in turn followed by the first reactive ion etch (RIE) plasma.

10. The method of claim 1 wherein the patterned polysilicon containing layer residue is formed separated from the patterned polysilicon layer incident to etching with the first reactive ion etch (RIE) plasma.

11. The method of claim 10 wherein the patterned polysilicon containing layer residue is formed unmasked.

* * * * *